US010450654B2

(12) United States Patent
Watanabe et al.

(10) Patent No.: US 10,450,654 B2
(45) Date of Patent: Oct. 22, 2019

(54) RADICAL GAS GENERATION SYSTEM

(71) Applicant: Toshiba Mitsubishi-Electric Industrial Systems Corporation, Chuo-ku (JP)

(72) Inventors: Kensuke Watanabe, Tokyo (JP); Yoichiro Tabata, Tokyo (JP); Shinichi Nishimura, Tokyo (JP)

(73) Assignee: Toshiba Mitsubishi-Electric Industrial Systems Corporation, Chuo-ku (JP)

( * ) Notice: Subject to any disclaimer, the term of this patent is extended or adjusted under 35 U.S.C. 154(b) by 299 days.

(21) Appl. No.: 15/506,063

(22) PCT Filed: Oct. 29, 2014

(86) PCT No.: PCT/JP2014/078724
§ 371 (c)(1),
(2) Date: Feb. 23, 2017

(87) PCT Pub. No.: WO2016/013131
PCT Pub. Date: Jan. 28, 2016

(65) Prior Publication Data
US 2018/0223433 A1  Aug. 9, 2018

(51) Int. Cl.
*C23C 16/50* (2006.01)
*C23C 16/513* (2006.01)
(Continued)

(52) U.S. Cl.
CPC ............ *C23C 16/513* (2013.01); *C23C 16/50* (2013.01); *H01J 37/32348* (2013.01);
(Continued)

(58) Field of Classification Search
CPC ............... H01L 21/31; H01L 37/32009; H01L 37/32384; C23C 16/50
See application file for complete search history.

(56) References Cited

U.S. PATENT DOCUMENTS 6,489,585 B1* 12/2002 Nakamura ........ H01J 37/32009
219/121.48
8,857,371 B2* 10/2014 Tabata ................... C23C 16/505
118/723 E
(Continued)

FOREIGN PATENT DOCUMENTS

JP 2001-135628 A 5/2001
JP 2004-111739 A 4/2004
(Continued)

OTHER PUBLICATIONS

International Search Report dated Jan. 20, 2015, in PCT/JP2014/078724 filed Oct. 29, 2014.
(Continued)

*Primary Examiner* — Robert M Kunemund
(74) *Attorney, Agent, or Firm* — Oblon, McClelland, Maier & Neustadt, L.L.P.

(57) ABSTRACT

In a radical gas generation system according to the present invention, a process chamber apparatus includes a table that causes a target object to rotate. A radical gas generator includes a plurality of discharge cells. Each of the plurality of discharge cells includes an opening. The opening is connected to the inside of the process chamber apparatus and faces the target object. Through the opening, a radical gas is output. Of the plurality of discharge cells, a discharge cell located farther from a center position of the rotation of the target object in a plan view includes a larger facing surface area that is a region in which a first electrode member and a second electrode member face each other.

6 Claims, 2 Drawing Sheets

(51) Int. Cl.
*H01L 21/31* (2006.01)
*H01J 37/32* (2006.01)
*H05H 1/24* (2006.01)
*H01L 21/02* (2006.01)

(52) U.S. Cl.
CPC .......... *H01L 21/31* (2013.01); *H05H 1/2406* (2013.01); *H01J 2237/3321* (2013.01); *H01L 21/02274* (2013.01)

(56) References Cited

U.S. PATENT DOCUMENTS

| | | |
|---|---|---|
| 2007/0281106 A1 | 12/2007 | Lubomirsky et al. |
| 2010/0081293 A1 | 4/2010 | Mallick et al. |
| 2011/0048326 A1 | 3/2011 | Kato et al. |
| 2012/0073501 A1 | 3/2012 | Lubomirsky et al. |
| 2014/0083362 A1 | 3/2014 | Lubomirsky et al. |
| 2014/0123897 A1* | 5/2014 | Tabata ................ H01J 7/32348 118/723 E |
| 2015/0184293 A1 | 7/2015 | Kato et al. |
| 2017/0226637 A1 | 8/2017 | Lubomirsky et al. |

FOREIGN PATENT DOCUMENTS

| | | |
|---|---|---|
| JP | 2007-266489 A | 10/2007 |
| JP | 2011-154973 A | 8/2011 |
| WO | WO 2007/140425 A2 | 12/2007 |

OTHER PUBLICATIONS

Office Action dated Apr. 23, 2018 in Korean Patent Application No. 10-2017-7007574 with unedited computer generated English translation.

Extended European Search Report dated Feb. 28, 2018 in European Patent Application No. 14898292.9, 9 pages.

Combined Office Action and Search Report dated Jul. 4, 2018 in Chinese Patent Application No. 201480082514.4 (with computer English translation obtained from the JPO).

* cited by examiner

RADICAL GAS GENERATION SYSTEM

TECHNICAL FIELD

The present invention relates to a radical gas generation system that can generate a radical gas and perform a process in which the radical gas is used. The present invention is applicable to, for example, formation of a high-performance insulation film on a target object.

BACKGROUND ART

In various industries including the semiconductor manufacturing, a need exists for multifunctional, high-quality thin films (e.g., highly insulative thin films, semiconductor thin films, highly dielectric thin films, light-emitting thin films, highly magnetic thin films, and superhard thin films).

For example, in the manufacturing of semiconductor devices, films for use in semiconductor chips include a highly conductive film with a low impedance that corresponds to circuit wiring, a highly magnetic film that functions as a wiring coil of a circuit or as a magnet, a highly dielectric film that functions as a capacitor in a circuit, and a highly insulative film that causes a less amount of electrical leakage current.

Examples of techniques that have been used to form these film include the thermal chemical vapor deposition (CVD) apparatus, the photo CVD apparatus, and the plasma CVD apparatus. Particularly, the plasma CVD apparatus has been commonly used. As compared to the thermal and photo CVD apparatuses or the like, the plasma CVD apparatus can lower the temperature of film formation and increase the speed of film formation, so that a film formation process can be accelerated.

For example, the following technique that uses the plasma CVD apparatus is generally employed to form, on a semiconductor substrate, a gate insulation film such as a nitride film (e.g., SiON or HfSiON) or an oxide film ($SiO_2$ or $HfO_2$).

Thus, a gas of $NH_3$ (ammonia), $N_2$, $O_2$, $O_3$ (ozone), or the like and a precursor gas of silicon, hafnium, or the like are directly supplied to a process chamber apparatus in which the CVD process is to be performed. In the process chamber apparatus, the precursor gas is dissociated to form metal particles, and then, a thin film such as a nitride film or an oxide film is formed on a target object by a chemical reaction between the metal particles and the above-mentioned gas of $NH_3$ (ammonia) or the like.

In the plasma CVD apparatus, high-frequency plasma or microwave plasma is directly generated in the process chamber apparatus. The target object is accordingly exposed to a radical gas or plasma ions (or electrons) having a high energy.

Patent document 1 is an example of related art documents in which techniques associated with plasma CVD apparatuses are disclosed.

In the film formation process performed in the plasma CVD apparatus, the target object is directly exposed to plasma, as mentioned above. The target object is heavily damaged by plasma (ions or electrons), so that the performance of a semiconductor function suffers.

In contrast, in the film formation process using the thermal and photo CVD apparatuses, the target object is not damaged by plasma (ions or electrons), and a high-quality film such as a nitride film or oxide film is formed accordingly. In such a film formation process, however, it is difficult to provide a large amount of highly concentrated radical gas source and it accordingly takes a very long time to form a film.

The recent thermal and photo CVD apparatuses use, as a source gas, an $HN_3$ gas or a $O_3$ gas, which is highly concentrated and readily dissociated by radiation of heat or light. In a CVD chamber apparatus, a thermal catalyst is provided. Thus, a catalytic action promotes dissociation of the gas in the thermal and photo CVD apparatus, whereby a film such as a nitride film or an oxide film can be formed in a short time. However, this saves only a limited amount of time, and thus, it is difficult to accelerate the film formation significantly.

An example of apparatuses that can reduce damages to the target object caused by plasma and can further accelerate the film formation is a film formation process apparatus of remote plasma type (see, for example, Patent Document 2).

According to the technique disclosed in Patent Document 2, a plasma generation region and a target object process region are separated by a partition (plasma confining electrode). Specifically, according to the technique disclosed in Patent Document 2, the plasma confining electrode is located between a high-frequency application electrode and a counter electrode on which a target object is placed. The technique disclosed in Patent Document 2 provides the target object with only neutral activated species.

According to the technique disclosed in Patent Document 3, part of a source gas is activated by plasma in a remote plasma source. In the remote plasma source, a gas channel circles around in a loop. An active gas generated in the remote plasma source is discharged and supplied to the apparatus in which a target object is placed.

Various source gases such as a nitrogen gas, an oxygen gas, an ozone gas, or a hydrogen gas may be used in the thin film technique according to Patent Document 3 and the like. An activated radical gas is generated from the source gas, and then, a thin film is formed on a target object through the use of the radical gas.

The radical gas is highly reactive. The radical gas in minute quantities (at a concentration less than or equal to about 1%: 10000 ppm) is sprayed onto a target object to promote a chemical reaction in the target object, whereby a film such as a nitrogen thin film, an oxide thin film, or a hydrogen-reduced film (a metal film with enhanced hydrogen bonding) can be efficiently formed in a short time.

A radical generation apparatus includes discharge cells. In the discharge cells, high-field plasma is created through the use of a dielectric barrier discharge, which is atmospheric pressure plasma. Consequently, a high-quality radical gas is generated from the source gas exposed to the plasma in the discharge cells.

PRIOR ART DOCUMENTS

Patent Documents

Patent Document 1: Japanese Patent Application Laid-Open No. 2007-266489
Patent Document 2: Japanese Patent Application Laid-Open No. 2001-135628
Patent Document 3: Japanese Patent Application Laid-Open No. 2004-111739

SUMMARY OF INVENTION

Problems to be Solved by the Invention

However, the conventional radical gas generators fail to generate an effective, highly reactive radical gas. Further, it is difficult to obtain a radical gas in large quantities. In addition, the lifetime of the generated radical gas is very short. Thus, it is difficult to minimize a decrease in concentration and to conduct a radical gas from the radical gas generator to a radical gas process area (a thin film generation area, namely, a process chamber apparatus) that is separate from the radical gas generator.

The radical gas outlet may be formed into an orifice such that a radical gas sprayed from the radical generator is applied to an object placed in the process chamber apparatus in a short time. This involves reducing the opening diameter of an opening which is a radical gas transmission path from the radical gas generator to the process chamber apparatus. Thus, reducing the pressure (creating a vacuum) in the process chamber apparatus causes a difference in pressure between the inside of the radical gas generator and the inside of the process chamber apparatus, so that the radical gas is sprayed into the process chamber apparatus at a high speed. The radical gas can be conducted from the radical gas generator to the process chamber apparatus while being kept in high concentrations.

According to the above-mentioned method, the opening needs to have a diameter of, for example, about several tens of millimeters. Unfortunately, through the opening of this size, the radical gas is sprayed onto only a limited part of the target object in the process chamber apparatus. This makes it difficult to form a thin film evenly on a large area (e.g., a target object having a diameter of 200 mm or more).

The present invention therefore has an object to provide a radical gas generation system (a film formation process system of remote plasma type) that includes a radical gas generator and a process chamber apparatus located apart from or adjacent to each other and is capable of conducting a radical gas from the radical gas generator to the process chamber apparatus and performing a process through the use of the radical gas evenly on, for example, a target object having a large area.

Means to Solve the Problems

In order to achieve the above-mentioned objective, a radical gas generation system according to the present invention includes a radical gas generator and a process chamber apparatus. The radical gas generator generates a radical gas from a source gas using a dielectric barrier discharge. The process chamber apparatus is connected to the radical gas generator, accommodates a target object, and performs, on the target object, a process in which the radical gas is used. The process chamber apparatus includes a table on which the target object is placed. The table causes the target object to rotate. The radical gas generator includes a plurality of discharge cells and a source gas supply unit. The plurality of discharge cells cause the dielectric barrier discharge. The source gas supply unit supplies the radical gas generator with the source gas. Each of the plurality of discharge cells includes a first electrode portion, a second electrode portion, and an opening. The first electrode portion includes a first electrode member. The second electrode portion is opposed to the first electrode portion and includes a second electrode member. The opening is connected to the inside of the process chamber and faces the target object placed on the table. The radical gas generated from the source gas using the dielectric barrier discharge is output through the opening. Of the plurality of discharge cells, a discharge cell located farther from a center position of the rotation of the target object in a plan view includes a larger facing surface area that is a region in which the first electrode member and the second electrode member face each other.

Effects of the Invention

The radical gas generation system according to the present invention includes the radical gas generator and the process chamber apparatus. The radical gas generator generates the radical gas from the source gas using the dielectric barrier discharge. The process chamber apparatus is connected to the radical gas generator, accommodates the target object, and performs, on the target object, the process in which the radical gas is used. The process chamber apparatus includes the table on which the target object is placed. The table causes the target object to rotate. The radical gas generator includes the plurality of discharge cells and the source gas supply unit. The plurality of discharge cells cause the dielectric barrier discharge. The source gas supply unit supplies the radical gas generator with the source gas. Each of the plurality of discharge cells includes the first electrode portion, the second electrode portion, and the opening. The first electrode portion includes the first electrode member. The second electrode portion is opposed to the first electrode portion and includes the second electrode member. The opening is connected to the inside of the process chamber and faces the target object placed on the table. The radical gas generated from the source gas using the dielectric barrier discharge is output through the opening. Of the plurality of discharge cells, a discharge cell located farther from the center position of the rotation of the target object in a plan view includes a larger facing surface area that is a region in which the first electrode member and the second electrode member face each other.

The radical gas generated in the radical gas generator can be conducted directly to the process chamber apparatus through the opening. This configuration eliminates the need for providing a plurality of alternating current high voltage sources to one radical gas generator and uses one alternating current high voltage source to control the amount (concentration) of the radical gas sprayed from each of the discharge cells. Thus, a radical gas process can be performed evenly on a target object having a large area.

DESCRIPTION OF EMBODIMENT

Figure 1:
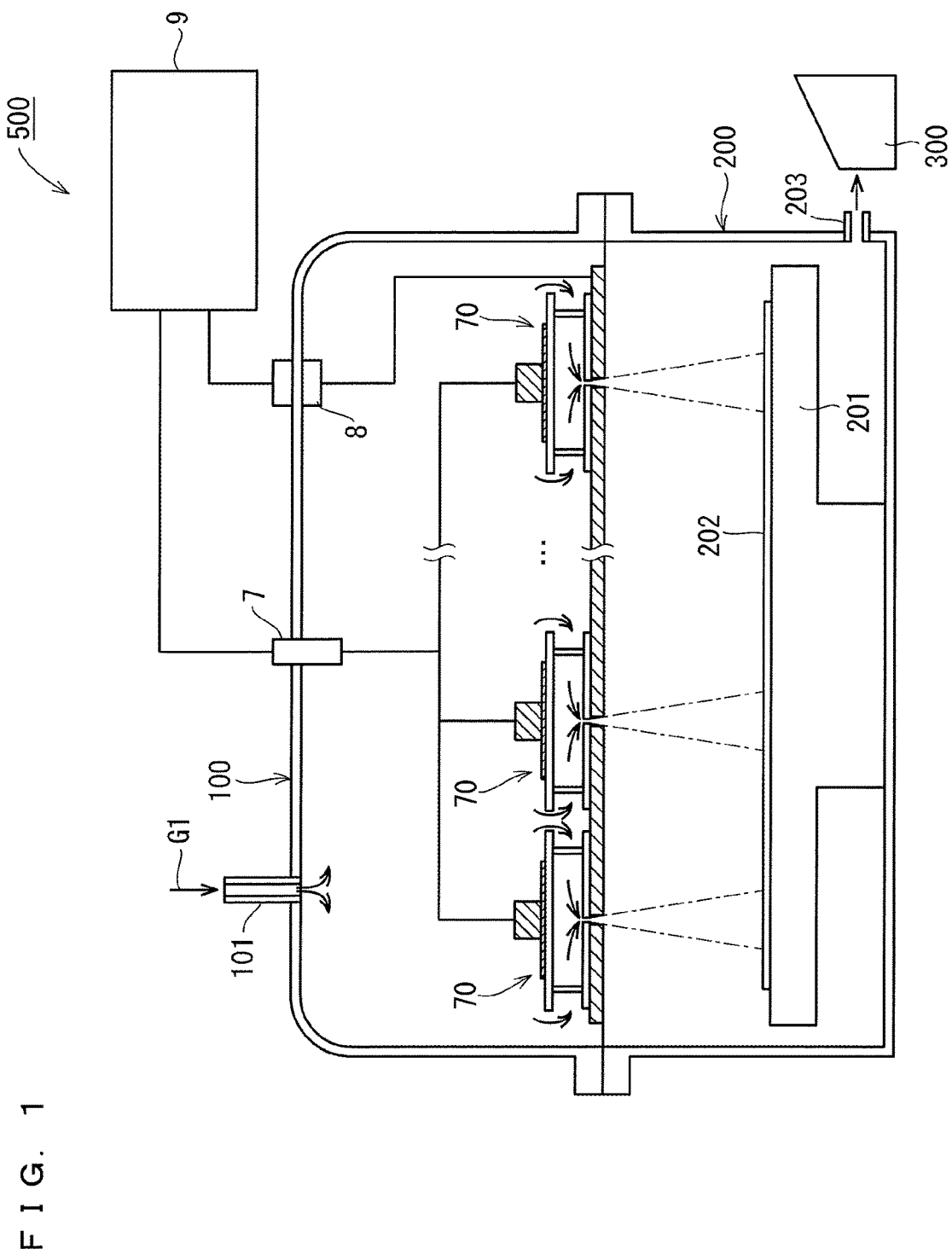
FIG. 1 A cross-sectional view of an example configuration of a radical gas generation system 500 according to the present invention.

As mentioned above, the inventors have found that, in a film formation process system of remote plasma type, reducing the opening diameter of an opening enables a radical gas, which is kept in high concentrations, to be conducted from a radical gas generator to a process chamber apparatus.

The radical gas generator and the process chamber apparatus vertically adjoin each other in such a manner that the radical gas generator is stacked on top of the process chamber apparatus. The opening is a radical gas transmission path from the radical gas generator to the process chamber apparatus. A plurality of openings are provided. The individual openings face the main surface of a target object.

In this configuration, however, it is difficult to perform a process in which the radical gas is used (hereinafter also referred to as, for example, a "film formation process") evenly on the target object placed in the process chamber apparatus, as mentioned above. Increasing the number of openings can smooth the unevenness to some extent but fails to eliminate the problem of the unevenness.

The inventors have found, as a workaround to the uneven film formation mentioned above, a configuration in which the target object is rotated in the process chamber in a plan view. In this configuration, however, the local rotation speed of the target object increases with increasing distance from the center of rotation in a planar direction (v (speed)=r (radius)×ω (angular velocity)). It is difficult to completely solve the above-mentioned problem of the uneven film formation process by the configuration in which the target object is rotated and the radical gas is sprayed into the process chamber through the individual openings.

The following configuration may be another workaround to the uneven film formation. As mentioned above, the plurality of openings, which are radical gas spraying portions, are provided. In this configuration, discharge cells are provided in one-to-one correspondence with the openings and the individual discharge cells control the amount of generated radical gas (the concentration of radical gas).

Each discharge cell may include an alternating current power supply and control (change) the electric power supplied from the alternating current power supply, so that the amount of radical gas (the concentration of the radical gas) varies among the discharge cells. This method requires a plurality of alternating current power sources and a plurality of high voltage source units. This leads to upsizing of the radical gas generation system as a whole, thus driving up costs.

Alternatively, the opening diameter of each opening (the aperture diameter of each orifice) may be changed such that the amount of radical gas varies among the discharge cells. In the case where the opening diameter of the opening for the radical gas (the aperture diameter of the orifice) varies among the discharge cells, the velocity of flow of radical gas sprayed from the opening also varies among the discharge cells. A film may not be formed evenly owing to variations in the velocity of flow of gas.

The inventors have invented the following configuration in which the amount of radical gas varies among the discharge cells. The present invention will be specifically described below with reference to drawings illustrating an embodiment thereof.

Embodiment

Figure 2:
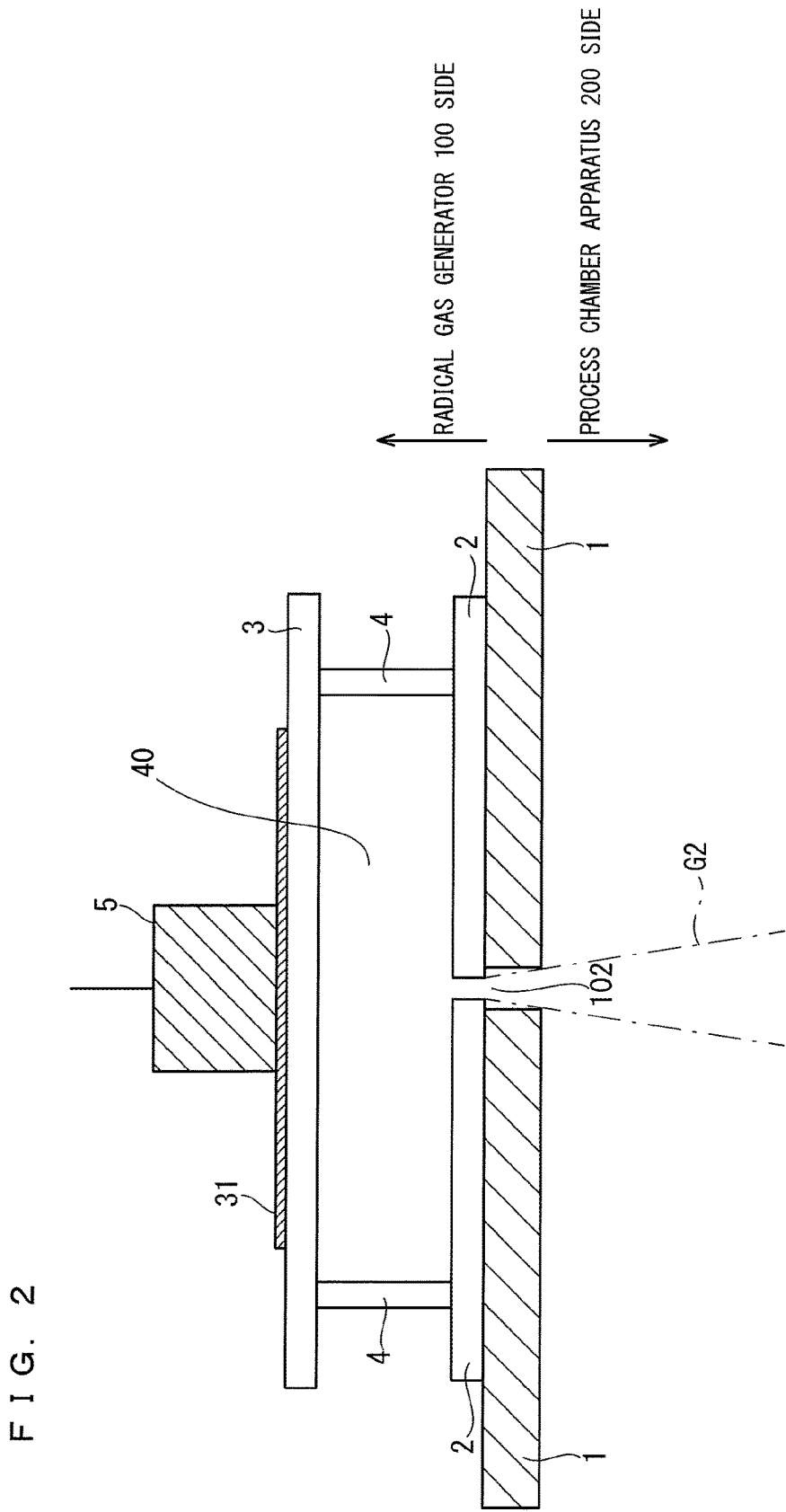
FIG. 2 An enlarged cross-sectional view of an example configuration of a discharge cell 70 according to the present invention.

FIG. 1 is a cross-sectional view of an example configuration of a radical gas generation system 500 according to an embodiment. FIG. 2 is an enlarged cross-sectional view of a configuration of a discharge cell 70 located in a radical gas generator 100.

The radical gas generation system 500 according to the present embodiment will be described below with reference to FIGS. 1 and 2.

As illustrated in FIG. 1, the radical gas generation system 500 includes the radical gas generator 100, a process chamber apparatus 200, an alternating current high voltage source 9, and a vacuum pump 300.

The radical gas generation system 500 is a film formation process system of remote plasma type in which the radical gas generator 100 that generates a radical gas G2 is located separately from the process chamber apparatus 200 that performs, for example, a film formation process in which the generated radical gas G2 is used.

As illustrated in FIG. 1, the bottom surface side of the radical gas generator 100 is in contact with the upper surface side of the process chamber apparatus 200. As will be described below, the inside of the radical gas generator 100 is connected to the inside of the process chamber apparatus 200 through an opening 102. As mentioned above, a plurality of openings 102 are provided.

In the radical gas generator 100, the radical gas G2 is generated from a source gas G1 using the dielectric barrier discharge (part of the source gas G1 is formed into a radical due to the dielectric barrier discharge, whereby the radical gas G2 is generated).

As illustrated in FIG. 1, the radical gas generator 100 includes a plurality of discharge cells 70. Specifically, the discharge cells 70 are located on the bottom surface of the radical gas generator 100.

As illustrated in FIG. 2, each of the discharge cells 70 includes first electrode portions 1 and 2 and second electrode portions 5, 31, and 3. The first electrode portions 1 and 2 are opposed to the second electrode portion 5, 31, and 3 with a predetermined gap therebetween.

Between the first electrode portions 1 and 2 and the second electrode portions 5, 31, and 3, a discharge space 40 is formed in which a dielectric barrier discharge occurs. At least one spacer 4 is located between the first electrodes 1 and 2 and the second electrode portions 5, 31, and 3 such that the gap length (the distance between the first electrode portions 1 and 2 and the second electrode portions 5, 31, and 3 in FIG. 2) is kept equal across the discharge space 40.

As illustrated in FIG. 2, the first electrode portions 1 and 2 include a low voltage electrode (which can be regarded as a first electrode member) 1 and a first dielectric (film) 2.

The low voltage electrode 1 is at the ground potential and is located on the bottom surface of the radical gas generator 100. All of the discharge cells 70 share one low voltage electrode 1. The first dielectric 2 is formed on the low voltage electrode 1.

The second dielectrics 5, 31, and 3 include a high voltage electrode block 5, a high voltage electrode (which can be regarded as a second electrode member) 31, and a second dielectric (film) 3, respectively.

The high voltage electrode 31 is formed on the second dielectric 3. The high voltage electrode block 5 is located on the high voltage electrode 31 so as to be connected thereto. The high voltage electrode block 5 is supplied with a high alternating current voltage. The high voltage electrode block 5 is electrically connected to the high voltage electrode 31, so that the high voltage is also applied to the high voltage electrode 31.

As illustrated in FIG. 1, the openings 102 that functions as orifices are provided in the individual discharge cells 70.

Each of the openings 102 is formed so as to penetrate the first dielectric 2 and the low voltage electrode 1. The opening 102 is formed in the middle of the first dielectric 2. Through the opening 102, the inside of the radical gas generator 100 (specifically, the discharge space 40) is connected with the inside of the process chamber apparatus 200. Thus, the radical gas G2 generated in the discharge space 40 is output to the inside of the process chamber apparatus 200 through the opening 102. The opening 102 faces the treatment surface of a target object 202 placed in the process chamber apparatus 200.

In one embodiment, the individual discharge cell 70 has a disc-shaped outline in a plan view. This means that the first dielectric 2 and the second dielectric 3 both have disc shapes and are located in parallel with each other (the high voltage electrode 31 also has a disc shape). When the discharge cell 70 is viewed from the above, the periphery of the first dielectric 2 coincides with the periphery of the second dielectric 3. The individual discharge cell 70 does not necessarily have a disc-shaped outline in a plan view and may have any shape as long as the same effects are produced.

The outlines of the discharge cells 70 are of the same shape. For example, in the case where the individual discharge cell 70 has a disc shaped outline as mentioned above, the size of the outline of the discharge cell 70 in a plan view is determined by the diameter of the first dielectric 2 (and the diameter of the second dielectric 3).

With reference to FIG. 1, the alternating current high voltage source 9 applies, to the radical gas generator 100 (specifically, to the discharge cells 70), an alternating current high voltage for discharging. When the alternating current high voltage is applied to the individual discharge cell 70, a dielectric barrier discharge occurs in the discharge space 40 of the discharge cell 70. Then, the radical gas G2 is generated in the discharge space 40 due to the interaction between the source gas G1 passing through the discharge space 40 and the dielectric barrier discharge. That is to say, the radical gas G2 is generated in the radical gas generator 100 using the dielectric barrier discharge (part of the source gas G1 is formed into a radical due to the dielectric barrier discharge, whereby the radical gas G2 is generated).

Provided on the upper surface portion of the radical gas generator 100 is a source gas supply unit 101. The source gas supply unit 101 supplies the radical gas generator 100 with the source gas G1, from which the radical gas G2 is to be derived. The source gas G1 supplied from the source gas supply unit 101 fills the radical gas generator 100. The fixed amount of the source gas G1 enters the discharge cells 70 from the outside thereof and flows through the discharge spaces 40.

The radical gas G2 generated in the radical gas generator 100 is sprayed into the process chamber apparatus 200. The process chamber apparatus 200 performs a process, such as thin film formation, on the main surface of the target object 202 using the radical gas.

Suppose that the radical gas generator 100 is supplied with the source gas G1 which is a nitrogen gas. In this case, a nitrogen radical gas is generated, as the radical gas G2, from the nitrogen gas in the discharge cells 70 of the radical gas generator 100. The process chamber apparatus 200 accordingly forms a nitride film on the target object 202 using the nitrogen radical gas G2 sprayed from the radical gas generator 100.

Suppose that the radical gas generator 100 is supplied with the source gas G1 which is an ozone gas or an oxygen gas. In this case, an oxygen radical gas is generated, as the radical gas G2, from the ozone gas or the oxide gas in the discharge cells 70 of the radical gas generator 100. The process chamber apparatus 200 accordingly forms an oxide film on the target object 202 using the radical gas G2 sprayed from the radical gas generator 100.

Suppose that the radical gas generator 100 is supplied with the source gas G1 which is a hydrogen gas or water vapor. In this case, a hydrogen radical gas is generated, as the radical gas G2, from the hydrogen gas in the discharge cells 70 of the radical gas generator 100, or an OH radical gas (a hydroxyl radical gas) is generated, as the radical gas G2, from the water vapor in the discharge cells 70 of the radical gas generator 100. The process chamber apparatus 200 accordingly forms a hydrogen-reduced film (a metal film with enhanced hydrogen bonding) on the target object 202 using the hydrogen radical gas G2 or the OH radical gas G2 sprayed from the radical gas generator 100.

Provided on the lower side surface of the process chamber apparatus 200 is a gas outlet 203 that is to be connected to the vacuum pump 300. The gas is discharged through the vacuum pump 300, so that the pressure in the process chamber apparatus 200 is maintained at about several torrs to several tens of torrs (several kPa). The vacuum pump 300 produces a flow of gas from the radical gas generator 100 to the process chamber apparatus 200. The openings 102 function as orifices so that a pressure division is provided between the radical gas generator 100 and the process chamber apparatus 200.

As illustrated in FIG. 1, a table 201 is located in the process chamber apparatus 200. The target object 202 is placed on the table 201. The target object 202 is exposed to the radical gas G2 sprayed from the openings 102 of the radical gas generator 100. Then, the target object 202 undergoes a process (e.g., formation of a thin film) in which the radical gas G2 is used. The table 201 rotates clockwise or counterclockwise in a plan view in a state in which the target object 202 is placed thereon. The target object 202 accordingly rotates along with the table 201.

As mentioned above, the outlines of the discharge cells 70 are of the same shape. The openings 102 formed in the discharge cells 70 have the same opening diameter. Thus, the pressure drop caused by a flow of gas becomes equal among the discharge cells 70 and the openings 102. The gas flows equally through the discharge cells 70, so that the radical gas G2 is sprayed into the process chamber apparatus 200 at approximately the same speed.

As illustrated in FIG. 1, one end of the alternating current high voltage source 9 is connected to the low voltage electrode 1 through a terminal 8. As mentioned above, the low voltage electrode 1 is shared by the discharge cells 70 and is at the ground potential. The other end of the alternating current high voltage source 9 is connected to the high voltage electrode blocks 5 of the discharge cells 70 through a terminal 7. The alternating current high voltage source 9 can apply an alternating current high voltage to the discharge cells 70 through the above-mentioned interconnection.

As mentioned above, one alternating current high voltage source 9 is provided for all of the discharge cells 70. The low voltage electrode 1 and the high voltage electrode block 5 each include a structure that can provide cooling using coolant or the like to dissipate the generated heat. In FIG. 2, such a structure for providing cooling is omitted for the sake of simplifying the drawing.

In each discharge cell 70, the discharge space 40 is the region in which the high voltage electrode 31 and the low voltage electrode 1 face each other. A low voltage potential of the alternating current high voltage source 9 is applied to the low voltage electrode 1, whereas a high voltage potential of the alternating current high voltage source 9 is applied to the high voltage electrode 31 through the terminal 7 and the high voltage electrode block 5. When an alternating current high voltage is applied between the low voltage electrode 1 and the high voltage electrode 31, the dielectric barrier discharge occurs in the individual discharge space 40. As mentioned above, the radical gas G2 is generated in the individual discharge space 40 due to the source gas G1 and the dielectric barrier discharge as mentioned above (part of the source gas G1 is formed into a radical due to the dielectric barrier discharge, whereby the radical gas G2 is generated.)

Through the openings 102, the generated radical gas G2 is sprayed on the target object 202 placed in the process chamber apparatus 200 as mentioned above. The concentration of the radical gas G2 sprayed into the process chamber apparatus 200 is normally less than 1% (10000 ppm) and most of the remaining gas is the source gas G1. The source gas G1 serves as a carrier gas that carries the generated radical gas G2 from the discharge cells 70 to the inside of the process chamber apparatus 200 in a short time.

Thus, the speed of the radical gas G2 sprayed from the openings 102 of the discharge cells 70 is dependent on the source gas G1. When the spray speed is low, it takes much time for the radical gas G2 to reach the target object 202 and part of the generated radical gas G2 probably disappears. Consequently, the target object 202 is exposed to the radical gas G2 in small concentrations (gas concentrations). This translates into a reduction in the efficiency of the process performed on the target object 202 through the use of the radical gas G2.

Thus, the speed of the radical gas G2 sprayed from the openings 102 of the discharge cells 70 needs to be kept at a certain level or higher. It is desirable that each of the openings 102 be shaped in an orifice with a small opening diameter.

In the case where each of the openings 102 has a small opening diameter, the radical gas G2 is sprayed at a higher speed, and thus, the radical gas G2 is less likely to disappear. However, the area of the target object 202 exposed to the radical gas G2 is confined within narrow limits. Although each of the discharge cells 70 has the opening 102 formed therein, it is difficult to apply the radical gas G2 evenly to the target object 202 in the state in which the area exposed to the radical gas G2 is limited within narrow limits.

It is desirable that the spray speed of the radical gas G2 be kept equal among the discharge cells 70. The discharge cells 70 have they same outline shape and the openings 102 have the same opening diameter such that the spray speed of the radical gas G2 becomes equal among the discharge cells 70.

It is undesirable that the spray speed of the radical gas G2 vary among the discharge cells 70. Meanwhile, each of the openings 102 needs to have a small opening diameter such that the radical gas G2 can be sprayed at a high speed. However, reducing the opening diameter makes it difficult to perform the radical gas process evenly over a wide area.

The present invention therefore has the following configuration such that the spray speed of the radical gas G2 is kept high and equal among the discharge cells 70 and that the radical gas process is performed evenly over a wide area of the target object 202.

When being exposed to the radical gas G2, the target object 202 is rotated along with the table 201 at a certain speed. The radical gas generator 100 includes the plurality of discharge cells 70. Each of the discharge cells 70 has the opening 102. The position of the individual opening 102 is fixed.

The target object 202 is rotated while the radical gas G2 is sprayed from the openings 102, so that the radical gas process can be performed more extensively on the target object 202. However, the circumferential speed varies from position to position, according to the distance from the rotation center of the target object 202. In the state where the radical gas G2 is sprayed from the discharge cells 70 at the same rate and the circumferential speed varies from position to position, the performance of the radical gas process on the target object 202 varies according to the distance from the rotation center of the target object 202.

Thus, the flow rate of the radical gas G2 sprayed from the discharge cells 70 needs to be changed and adjusted with respect to the rotation center of the target object 202. In other words, the flow rate component of the radical gas G2, which has been formed into a radical and is to be sprayed from the discharge cells 70, needs to be controlled in accordance with the circumferential speed associated with the rotation of the target object 202 (the table 201) such that the radical gas process is performed evenly on the target object 202.

In the present invention, the flow rate of the radical gas G2 is controlled in such a manner that, of the discharge cells 70, a discharge cell 70 located farther from the center position of the rotation of the target object 202 in a plan view includes a larger facing surface area that is a region in which the high voltage electrode 31 and the low voltage electrode 1 face each other. Specifically, of the discharge cells 70, a discharge cell 70 located farther from the center position of the rotation of the target object 202 includes a larger high voltage electrode 31, which is formed on the second dielectric 3.

The size of the discharge space 40 varies according to the position of the discharge cell 70, and thus, the amount of the generated radical gas G2 also varies. The flow rate component formed into a radical can be changed according to the position of the discharge cell 70.

The circumferential speed is higher at a position farther from the rotation center of the target object 202, and thus, such a position is exposed to the radical gas G2 for a shorter period of time. Conversely, the circumferential speed is lower at a position closer to the rotation center of the target object 202, and thus, such a position is exposed to the radical gas G2 for a longer period of time. Here, the rotation speed (angular speed) of the target object 202 is constant. The high voltage electrode 31 adheres to (is bonded to) the second dielectric 3 in such a manner that the amount of the radical gas (the concentration of the radical gas) generated in the discharge cell 70 is inversely proportional to the exposure time determined based on the position of the discharge cell 70. For example, the high voltage electrodes 31 may be configured as will be descried below such that the size of the discharge space 40 can be varied.

Take, for example, two discharge cells 70. One of the discharge cells 70 is located at a first distance from the rotation center of the target object 202 in a plan view. The other one of the discharge cells 70 is located at a second distance from the rotation center of the target object 202 in a plan view. The first distance is shorter than the second distance. In this case, the area of the high voltage electrode 31 is set to be larger in the other one of the discharge cells 70 than in the one of the discharge cells 70. Thus, the flow rate component of the radical gas G2 that has been formed into a radical and is to be sprayed from the opening 102 of the other one of the discharge cells 70 is set to be greater than the flow rate component of the radical gas G2 that has been formed into a radical and is to be sprayed from the openings 102 of the other one of the discharge cells 70.

The spray speed of the radical gas G2 is determined based mainly on the outside shapes of the dielectrics 2 and 3. As mentioned above, it is desirable that the outlines of the discharge cells 70 be of the same shape such that the radical gas G2 is sprayed at the same speed. As long as the outside shapes of the dielectrics 2 and 3 are equal among the discharge cells 70, the radical gas G2 can be sprayed from the discharge cells 70 at approximately the same speed, regardless of the differences in the outside shape of the high voltage electrode 31.

As mentioned above, in the radical gas generation system 500 according to the present embodiment, the radical gas generator 100 includes the plurality of discharge cells 70 and each of the discharge cells 70 has the opening 102. The radical gas G2 is conducted from the radical gas generator 100 to the process chamber apparatus 200 through the openings 102. The target object 202 is rotated. The size of the discharge space 40 varies among the discharge cell 70 according to the distance from the rotation center of the target object 202.

Thus, the radical gas G2 generated in the radical gas generator 100 (the radical gas G2 that is part of the source gas G1 formed into a radical due to the dielectric barrier discharge) can be conducted directly to the process chamber apparatus 200 through the openings 102. This configuration eliminates the need for providing a plurality of alternating current high voltage sources 9 to one radical gas generator 100 and uses one alternating current high voltage source 9 to control the amount (concentration) of the radical gas G2 sprayed from each of the discharge cells 70. The radical gas process can be performed evenly on the target object 202 having a large area.

Only the area of the high voltage electrode 31 (electrode opposite areas) varies while the discharge cells 70 have the same outline shape (specifically, the dielectrics 2 and 3 of the discharge cells 70 have the same outside shape) and the openings 102 of the discharge cells 70 have the same opening diameter. The amount (concentration) of the radical generated in the discharge space 40 is variably controlled to be less than 1% at most. The amount (concentration) of the radical can be controlled according to the position of the individual discharge cell 70 while the gas is sprayed through the openings 102 at approximately the same speed.

The target object 202 is rotated. Thus, the opening diameter of the individual opening 102 through which the radical gas G2 is sprayed can be reduced and the speed of the radical gas G2 can be increased accordingly. The radical gas G2 can reach the target object 202 in a short time, so that the radical gas G2 is less likely to disappear before reaching the target object 202.

The dielectrics 2 and 3 that are located in the individual discharge cell 70 so as to face the discharge space 40 may be made of single-crystal sapphire or quartz.

In the discharge space 40, a dielectric barrier discharge occurs, inflicting discharge damage to the dielectrics (dielectric films) 2 and 3. The dielectrics 2 and 3 made of single-crystal sapphire or quartz have improved resistance properties, which can minimize the amount of particles that are deposited on the dielectrics 2 and 3 due to the dielectric barrier discharge.

In the radical gas generator 100, the discharge space 40 needs to be placed in a high-field plasma state such that the high-quality radical gas G2 is generated through the use of the dielectric barrier discharge occurring in the discharge space 40. The electric filed in the discharge space 40 is dependent on the value obtained by multiplying the gas pressure in the discharge space 40 by the gap length in the discharge space. It is required that the value obtained by "P·d(kPa·cm)" be less than or equal to a predetermined value in order to create the high-field plasma state. Here, P denotes the pressure in the radical gas generator 100 and d denotes the gap length of the individual discharge cell 70 (the distance between the first dielectric 2 and the second dielectric 3, which is equal among the discharge cells 70).

Assume that the same value is obtained as the product of P and d in the following two cases, one case (referred to as the former case) fulfilling the condition of "atmospheric pressure+shot gap length" and the other case (referred to as the latter case) fulfilling the condition of "reduced pressure+long gap length". The latter case has the advantages over the latter case. That is, the latter case has the advantages that the speed of the gas flowing through the discharge space 40 is increased and that the gap length (the wall of a discharge surface) is extended to minimize the loss of the radical gas G2 caused by a collision of the radical gas G2 with the wall (, or to minimize a reduction in the amount of the generated radical gas (the concentration of the generated radical gas)).

The inventors have found that it is desirable that the radical gas generator 100 fulfill the following conditions in order to drive the dielectric barrier discharge stably and to generate an excellent radical gas.

The inner gas pressure P of the radical gas generator 100 is desirably set at about 10 to 30 kPa and the gap length d of the discharge space 40 is desirably set at about 0.3 to 3 mm such that the product of P and d is of the order of 0.3 to 9 (kPa·cm).

The invention claimed is:

1. A radical gas generation system comprising:
a radical gas generator that generates a radical gas from a source gas using a dielectric barrier discharge; and
a process chamber apparatus that is connected to said radical gas generator, accommodates a target object, and performs, on said target object, a process in which said radical gas is used, wherein
said process chamber apparatus includes a table on which said target object is placed, said table causing said target object to rotate,
said radical gas generator includes:
  a plurality of discharge cells that cause said dielectric barrier discharge; and
  a source gas supply unit that supplies said radical gas generator with said source gas,
each of said plurality of discharge cells includes:
  a first electrode portion including a first electrode member;
  a second electrode portion that is opposed to said first electrode portion and includes a second electrode member; and
  an opening connected to the inside of said process chamber and facing said target object placed on said table, said radical gas generated from said source gas using said dielectric barrier discharge is output through said opening,
said plurality of discharge cells share said first electrode member, and
of said plurality of discharge cells, a discharge cell located farther from a center position of the rotation of said target object in a plan view includes a larger said second electrode member than a discharge cell located closer to the center position of the rotation of said target object in the plan view.

2. The radical gas generation system according to claim 1, wherein
each of said plurality of discharge cells further includes a dielectric that faces a discharge space in which said dielectric barrier discharge occurs, and
said dielectric is made of single sapphire or quartz.

3. The radical gas generation system according to claim 1, wherein said radical gas generator has an internal gas pressure of 10 to 30 kPa, and a distance between said first electrode portion and said second electrode portion is set at 0.3 to 3 mm.

4. The radical gas generation system according to claim 1, wherein said source gas comprises a nitrogen gas, said radical gas generator generates, as said radical gas, a nitrogen radical gas from said nitrogen gas, and said process chamber apparatus forms a nitride film on said target object using said nitrogen radical gas.

5. The radical gas generation system according to claim 1, wherein said source gas comprises an ozone gas or an oxygen gas, said radical gas generator generates, as said radical gas, an oxygen radical gas from said ozone gas or said oxygen gas, and said process chamber apparatus forms an oxide film on said target object using said oxygen radical gas.

6. The radical gas generation system according to claim 1, wherein said source gas comprises a hydrogen gas or water vapor, said radical gas generator generates, as said radical gas, a hydrogen radical gas or hydroxyl (OH) radical gas from said hydrogen gas or said water vapor, and said process chamber apparatus forms a metal film with enhanced hydrogen bonding on said target object using said hydrogen radical gas or said OH radical gas.

* * * * *